(12) United States Patent
Shouji

(10) Patent No.: US 7,960,991 B2
(45) Date of Patent: Jun. 14, 2011

(54) TEST APPARATUS AND PROBE CARD

(75) Inventor: Yasushi Shouji, Tokyo (JP)

(73) Assignee: Advantest Corporation, Tokyo (JP)

( * ) Notice: Subject to any disclaimer, the term of this patent is extended or adjusted under 35 U.S.C. 154(b) by 1 day.

(21) Appl. No.: 12/509,770

(22) Filed: Jul. 27, 2009

(65) Prior Publication Data
US 2010/0026333 A1 Feb. 4, 2010

Related U.S. Application Data

(63) Continuation of application No. PCT/JP2007/073597, filed on Dec. 6, 2007.

(30) Foreign Application Priority Data

Jan. 29, 2007 (JP) ................................ 2007-018425

(51) Int. Cl.
*G01R 31/00* (2006.01)
*G01R 31/26* (2006.01)
(52) U.S. Cl. ......... 324/756.03; 324/754.01; 324/754.03; 324/754.07; 324/762.01
(58) Field of Classification Search ........... 324/754–765
See application file for complete search history.

(56) References Cited

U.S. PATENT DOCUMENTS

| | | | |
|---|---|---|---|
| 5,550,480 A * | 8/1996 | Nelson et al. | 324/754 |
| 5,747,994 A | 5/1998 | Suga | |
| 5,754,057 A * | 5/1998 | Hama et al. | 324/754 |
| 6,075,373 A * | 6/2000 | Iino | 324/754 |
| 7,504,822 B2 * | 3/2009 | Parrish et al. | 324/158.1 |
| 2008/0054917 A1* | 3/2008 | Henson et al. | 324/754 |

FOREIGN PATENT DOCUMENTS

| | | |
|---|---|---|
| JP | 61-125031 A | 6/1986 |
| JP | H4-28442 U | 3/1992 |
| JP | 8-306750 A | 11/1996 |
| JP | H09-298223 A | 11/1997 |
| JP | 11-121569 A | 4/1999 |

OTHER PUBLICATIONS

International Search Report (ISR) for PCT/JP2007/073597 for Examiner consideration, citing U.S. Appl. Nos. 1 and Foreign Patent Document Nos. 1-4 listed above.
Written Option (PCT/ISA/237) of PCT/JP2007/073597.

\* cited by examiner

*Primary Examiner* — Ha Tran T Nguyen
*Assistant Examiner* — Emily Y Chan
(74) *Attorney, Agent, or Firm* — Chen Yoshimura LLP

(57) ABSTRACT

Provided is a test apparatus including a test head main body 130 that communicates a signal with the device under test 200, a prober 110 on which the device under test 200 is mounted, and a probe card 300 positioned between the test head main body 130 and the prober 110, where the probe card 300 includes: a plurality of probe pins 320 provided on a surface thereof facing the prober 110 and electrically connected to a terminal of the device under test 200; a plurality of test head pads 330 provided on a surface thereof facing the test head main body 130 and electrically connected to spring pins 129 on the test head main body 130 and to the probe pins 320; and prober pads 340 provided on a surface thereof facing the prober 110 and electrically connected to the plurality of probe pins 320.

8 Claims, 16 Drawing Sheets

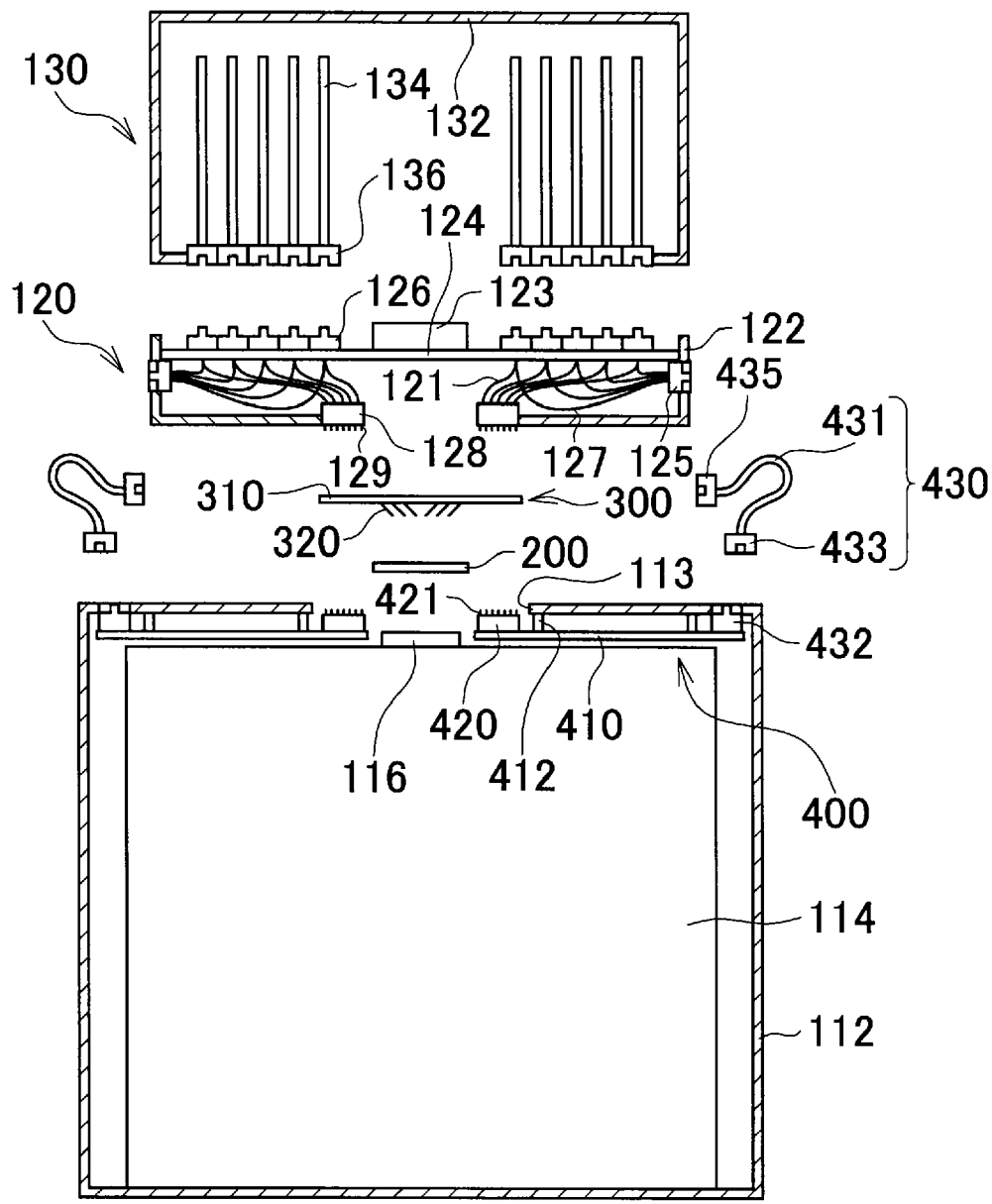
F I G. 1

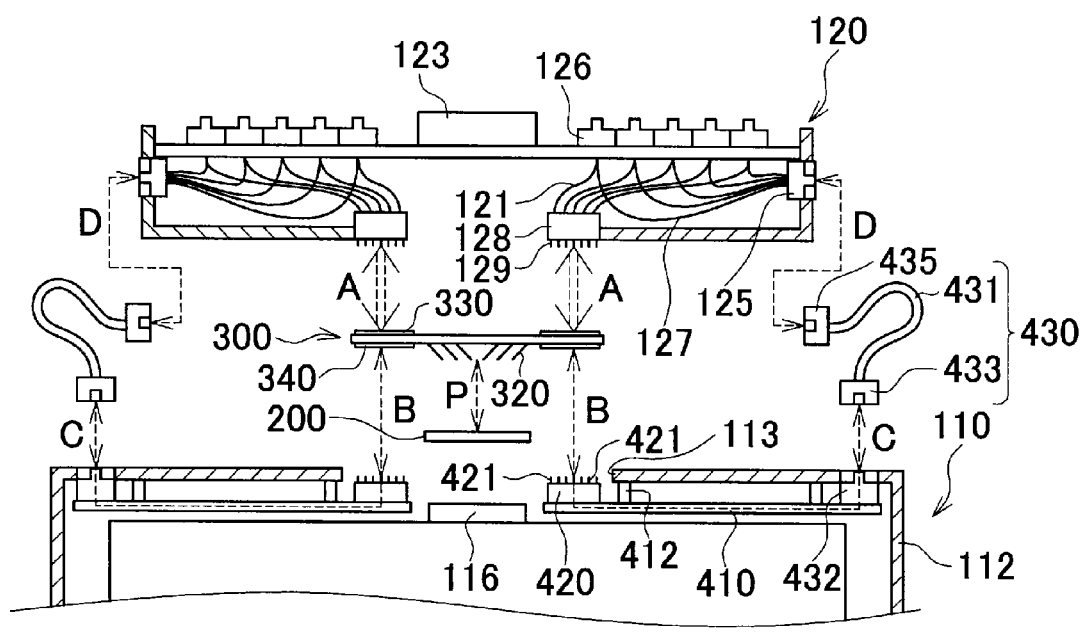
F I G . 6

TEST APPARATUS AND PROBE CARD

CROSS REFERENCE TO RELATED APPLICATION

This is a continuation application of PCT/JP2007/073597 filed on Dec. 6, 2007 which claims priority from a Japanese Patent Application NO. 2007-18425 filed on Jan. 29, 2007, the contents of which are incorporated herein by reference.

BACKGROUND

1. Technical Field

The present invention relates to a test apparatus and a probe card. In particular, the present invention relates to a test apparatus that tests a wafer or the like having a connection terminal, as a device under test, and to a probe card mounted thereto.

2. Related Art

In a wafer test in which a semiconductor circuit or a semiconductor device (DUT) and the like is tested in a wafer form, a component referred to as "probe card" is used for providing electrical connection to minute connection terminals on the wafer. A probe card is positioned between a device under test and a test apparatus to provide electric connection to them.

A probe card has probe pins to abut against minute connection terminals of a device under test, for allowing electrical connection. In addition, a probe card has pads and the like to abut against spring pins provided for a semiconductor test apparatus. According to them, a device under test and a test apparatus are electrically connected to each other, without trouble of removing/mounting or plugging/unplugging of connectors and so on.

The probe card is exchangeable in most test apparatuses. Moreover, many types of devices under test can be tested using a single test apparatus, by preparing many types of probe cards corresponding to the number of specifications of the devices under test.

Japanese Patent Application Publication No. 08-306750 proposes usage of, in a wafer test apparatus, a probe card equipped with a function of diagnosing the test apparatus itself (self-diagnosis function), in an effort to provide the test apparatus with a variety of functions using a probe card, which is small and easy to exchange.

Japanese Patent Application Publication No. 09-298223 discloses a test apparatus to which probe cards of different sizes are mounted, thereby increasing the types of probe cards mountable to the test apparatus, further enhancing the availability of the test apparatus.

Recently, as devices under test have been improved to have advanced functions, the number of connection terminals formed on a wafer, i.e., a device under test, is noticeably increasing. Test apparatuses are also being equipped with improved performance and advanced functions, to conduct a plurality of types of tests simultaneously. Consequently, there is a demand to increase the number of signal transfer paths to a device under test, so as to improve the throughput of a test.

If the number of connection terminals in a device under test is increased, the number of probe pins mounted to a probe card also increases. The probe pin itself is a minute element, and the probe card is sufficiently smaller than a device under test. Therefore, the device under test can still maintain connection even if the number of connection terminals has increased, by simply increasing the number of probe pins.

With respect to the connection between the probe card and a test apparatus, however, space allocation is becoming a problem. Specifically, spring pins widely used for connecting a test apparatus to a probe card has such a movable structure that is biased in an elongating direction and is shortened when abutting against a pad. Therefore, a spring pin has to have a certain thickness.

Moreover, some probe cards have spring pins shaped as needles or as bars, which repeat being in contact with and apart from the pads as the test apparatus is used. For this reason, a pad is required to have a width or a space sufficient for the thickness of a spring pin.

The above requirements impose limitation on the number of signal transfer paths formed between a test apparatus and a probe card, which hinders improvement in throughput of a test apparatus. For other things, a device under test that has a tremendously large number of connection terminals requires an expensive dedicated test apparatus. An example of such device under tests having many connection terminals is a driving circuit for liquid crystal display devices which have recently been widely produced.

SUMMARY

Therefore, it is an object of an aspect of the innovations herein to provide a test apparatus and a probe card, which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary test apparatus for testing a device under test, includes: a test head that communicates a signal with the device under test and tests the device under test; a prober on which the device under test is mounted; and a probe card that is positioned between the test head and the prober and that transfers a signal between the test head and the device under test, where the test head includes a plurality of test head pins on a surface thereof facing the probe card, the plurality of test head pins electrically connected to the probe card, the probe card includes: a plurality of probe pins that are provided on a surface of the probe card facing the prober and that are electrically connected to a terminal of the device under test; a plurality of test head pads that are provided on a surface of the probe card facing the test head and that are electrically connected to the test head pins and to the probe pins; and prober pads that are provided on a surface of the probe card facing the prober and that are electrically connected to the probe pins, and the prober includes: a prober connection section that is provided on a surface of the prober facing the probe card and that is electrically connected to the prober pads; and a transfer path for transferring a signal between the test head and the prober connection section.

According to the second aspect related to the innovations herein, one exemplary probe card is a probe card provided between a test head and a prober within a test apparatus that tests a device under test, the test head communicating a signal with the device under test and testing the device under test, and the prober having the device under test mounted thereon, the probe card transferring a signal between the test head and the device under test and including: a plurality of probe pins that are provided on a surface of the probe card facing the prober and that are electrically connected to a terminal of the device under test; a plurality of test head pads that are provided on a surface of the probe card facing the test head and that are electrically connected to test head pins on the test head and to the probe pins; and prober pads that are provided on a surface of the probe card facing the prober, electrically connected to a prober connection section on the prober, electrically connected to the test head via a transfer path, and electrically connected to the probe pins, the transfer path connecting the prober connection section to the test head.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 1 is a view showing each constituting element of a test apparatus 100 separately from each other.

FIG. 6 schematically shows the structure of a signal transfer path 400 formed in the test apparatus 100.

DESCRIPTION OF EXEMPLARY EMBODIMENTS

Figure 2:
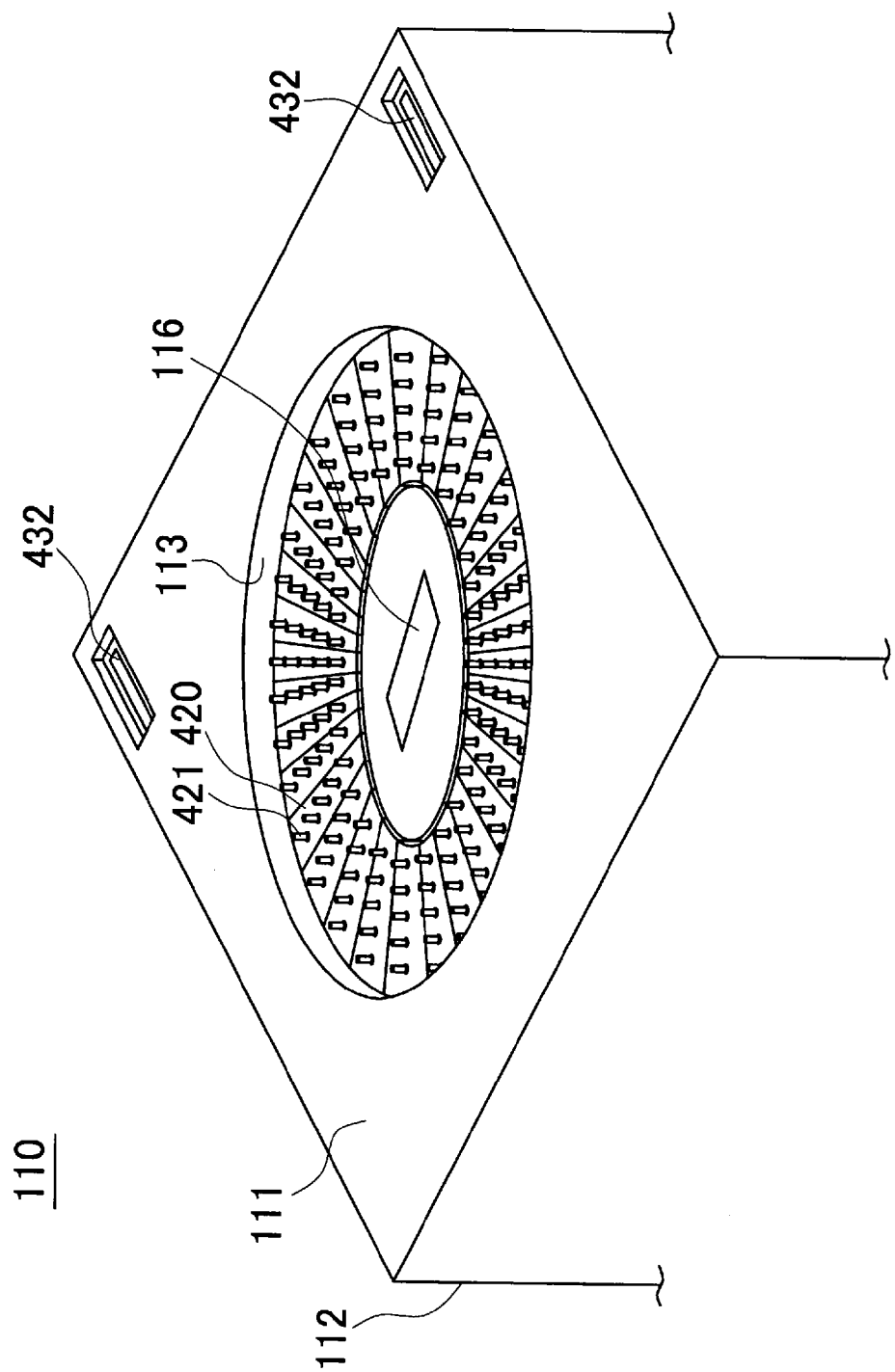
FIG. 2 shows the placement of each element on an upper surface 111 of a prober 110.

Some aspects of the invention will now be described based on the embodiments, which do not intend to limit the scope of the present invention, but exemplify the invention. All of the features and the combinations thereof described in the embodiment are not necessarily essential to the invention.

FIG. 1 is a cross sectional view showing each constituting element of a test apparatus 100 in an embodiment, separately from each other. As shown in this drawing, the test apparatus 100 includes a prober 110, a probe card 300, a performance board 120, and a test head main body 130, which are stacked in the stated order. The test apparatus 100 also includes a connectorized cable 430 for connecting the prober 110 and the performance board 120, as detailed later. When the test apparatus 100 is driven, a device under test 200 such as a wafer is placed between the prober 110 and the probe card 300.

A prober main body 114 of the prober 110 is accommodated in a case 112 having an opening 113 on its upper surface. A chuck 116 on the upper surface of the prober main body 114 is used to retain the device under test 200 within the opening 113 during a test.

In the present embodiment, a signal transfer path 400 is created on the upper surface inside of the prober 110. The signal transfer path 400 is formed to include a connection substrate 410 suspending from the inner upper surface 111 of the case 112 via a spacer 412. An end of the connection substrate 410 is provided with a pin module 420 having a plurality of spring pins 421. The other end of the connection substrate 410 is provided with a cable connector 432.

The pin module 420 and the cable connector 432 are electrically connected to each other, via wiring (not shown in the drawing) formed on the connection substrate 410. Moreover, the cable connector 432 is connected to an end of the connectorized cable 430, the connectorized cable 430 being a multicore cable 431 having cable connectors 433 and 435 at both ends.

The probe card 300 includes a substrate 310 having a smaller area than the opening 113 of the prober 110, and probe pins 320 protruding downward from its lower surface. The specification and the placement of the probe pins 320 are determined depending on the structure of each device under test 200. The probe card 300 is provided within the opening 113 of the prober 110, with its probe pins 320 abutting against the device under test 200, to provide electric connection to the device under test 200.

The performance board 120 has a substrate 124, the lower surface of which is covered by a case 122. A plurality of card connectors 126 are mounted to the upper surface of the substrate 124. A plurality of pin modules 128 are mounted at the bottom of the case 122. Each of the pin modules 128 has a plurality of spring pins 129. Each spring pin 129 is connected to any of the card connectors 126 on the substrate 124 via a connection cable 121. Note that the performance board 120 may include therein a dedicated circuit 123.

The performance board 120 also includes a cable connector 125 at a side surface of the case 122. The cable connector 125 is electrically connected to any of the card connectors 126. The cable connector 125 is also coupled to the other end of the connectorized cable 430, as detailed later.

The test head main body 130 includes a case 132 for accommodating a plurality of pin electronics cards 134. Each of the pin electronics cards 134 has a connector 136 at the lower end thereof, and is connected to any of the card connectors 126 of the performance board 120.

In this way, the prober 110, the probe card 300, the performance board 120, and the test head main body 130 are provided as elements separable from each other. According to this structure, the test apparatus 100 is able to perform a wide variety of tests by arbitrarily combining the probe card 300, the performance board 120, and the pin electronics cards 134, depending on the type of the device under test 200 as well as the test to be performed, and so on. A device under test 200 having a different specification can be tested by exchanging only some of the parts of the probe card 300 or the like, which leads to cost reduction pertaining to tests while improving the operation ratio of the test apparatus 100.

Here, the prober 110 exclusively physically operates the device under test 200. Specifically, the prober 110 transfers the device under test 200 to the chuck 116 thereby maintaining it, and discharges the device under test 200 after the test. Once the test of one device under test 200 is over, the prober 110 supplies the next device under test 200.

On the other hand, the test head main body 130 performs an electronic test function of a device under test 200. The pin electronics cards 134 mounted to the test head main body 130 are respectively equipped with test procedures or test data to be executed, and conduct a test by communicating signals with the device under test 200 on the chuck 116 via the performance board 120 and the probe card 300 as detailed later.

FIG. 2 shows a layout on the upper surface 111 of the prober 110 for the test apparatus 100. As shown in this drawing, a round opening 113 is formed in the center of the upper surface 111 of the prober 110. In this drawing, the probe card 300 is not present, to expose the chuck 116 in the center of the opening 113.

A multitude of pin modules 420 are provided in a radial formation to surround the chuck 116. Each of the pin modules 420 includes a plurality of spring pins 421. Each spring pin 421 is biased upward, and expands and contracts individually.

At two corners of the upper surface 111, a pair of cable connectors 432 are placed. In this drawing, the cable connector 432 is not connected to anything.

Figure 3:
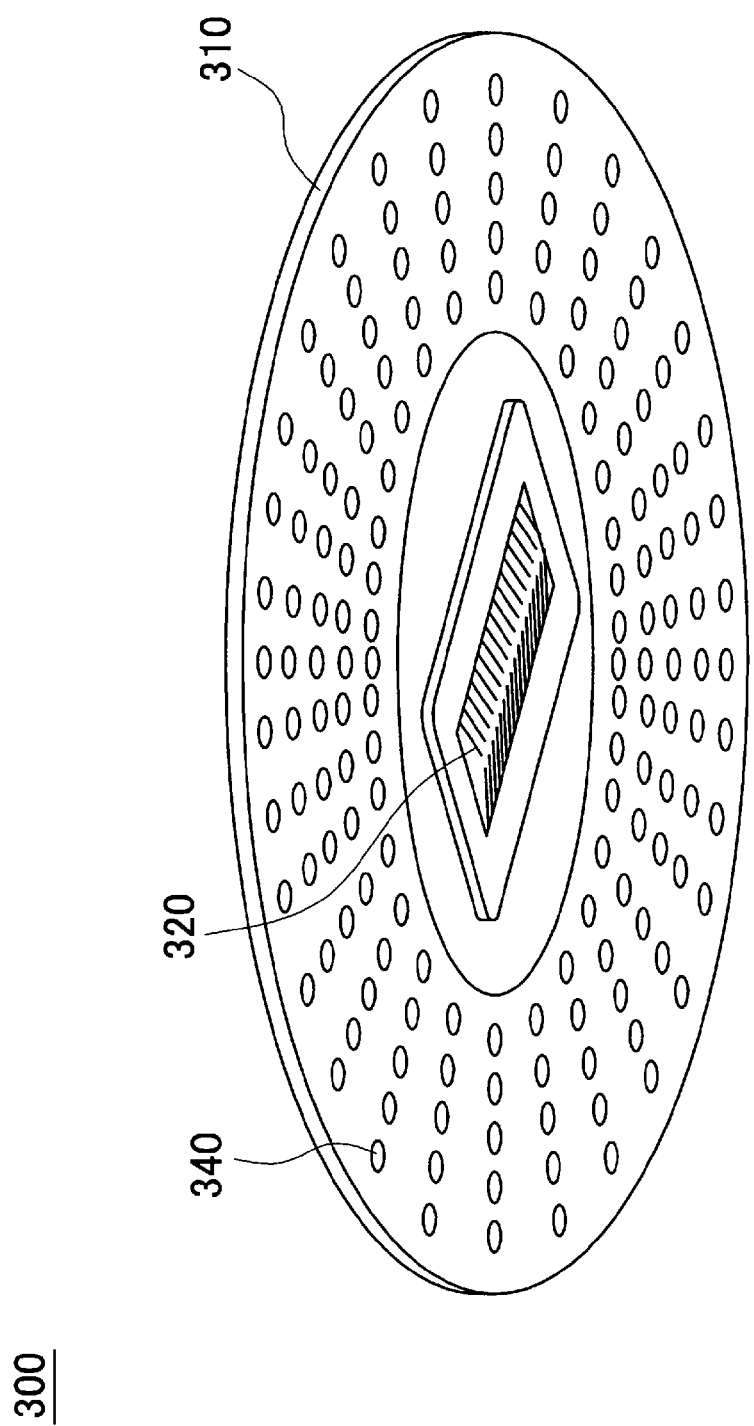
FIG. 3 is a view of a probe card 300 seen from the prober 110.

FIG. 3 is a view of the probe card 300 in the test apparatus 100, seen from the prober 110 (i.e. looked up at from below). As shown in this drawing, the probe card 300 includes a round substrate 310 and a multitude of pads 340 formed on the lower surface of the substrate 310. A plurality of probe pins 320 are placed in the center of the lower surface of the probe card 300. Each of the pads 340 has a flat surface, and is connected to any of the probe pins 320.

Figure 4:
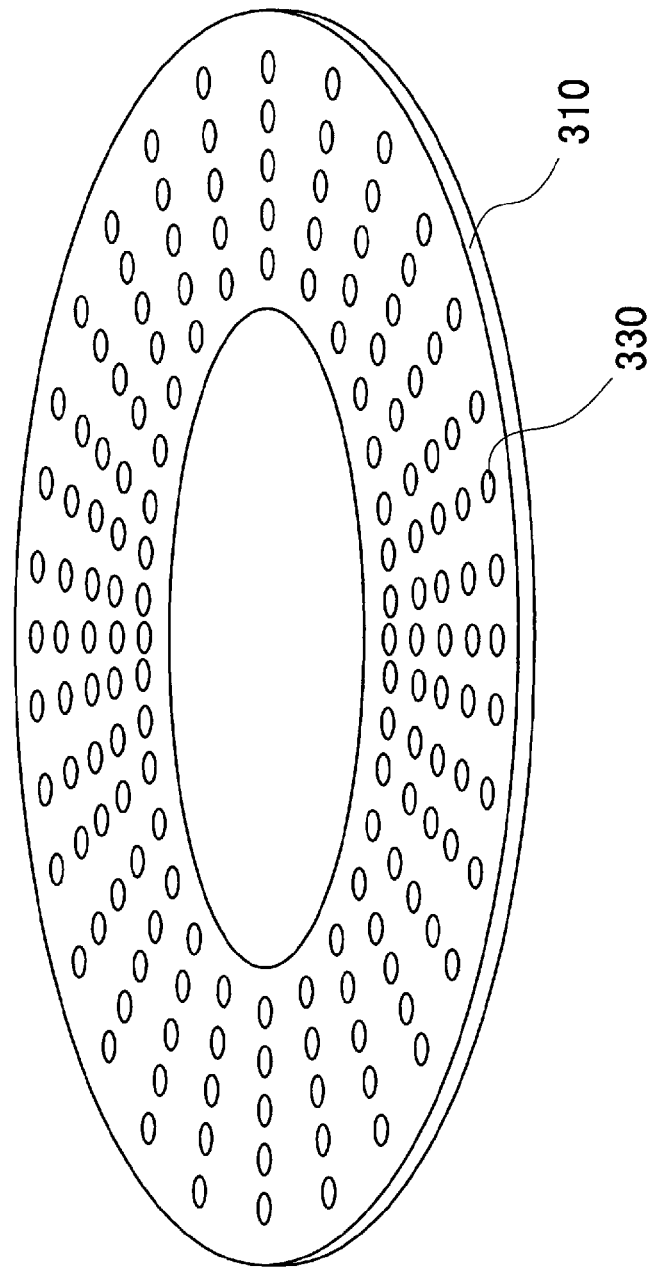
FIG. 4 is a view of the probe card 300 seen from a test head main body 130.

FIG. 4 is a view of the probe card 300 seen from the test head main body 130 (i.e. looked down on from above). As shown in this drawing, a multitude of pads 330, each also having a flat surface, are formed on the upper surface of the probe card 300. Note that the pads 330 are independent from the pads 340, and each pad 330 is connected to any of the probe pins 320 independently.

For facilitating illustration, these drawings illustrate five concentric arrays of pads 330 and 340. However, the number of pads used for an actual probe card 300 is far greater than this. Moreover, the arrangement is not limited to as described above.

Figure 5:
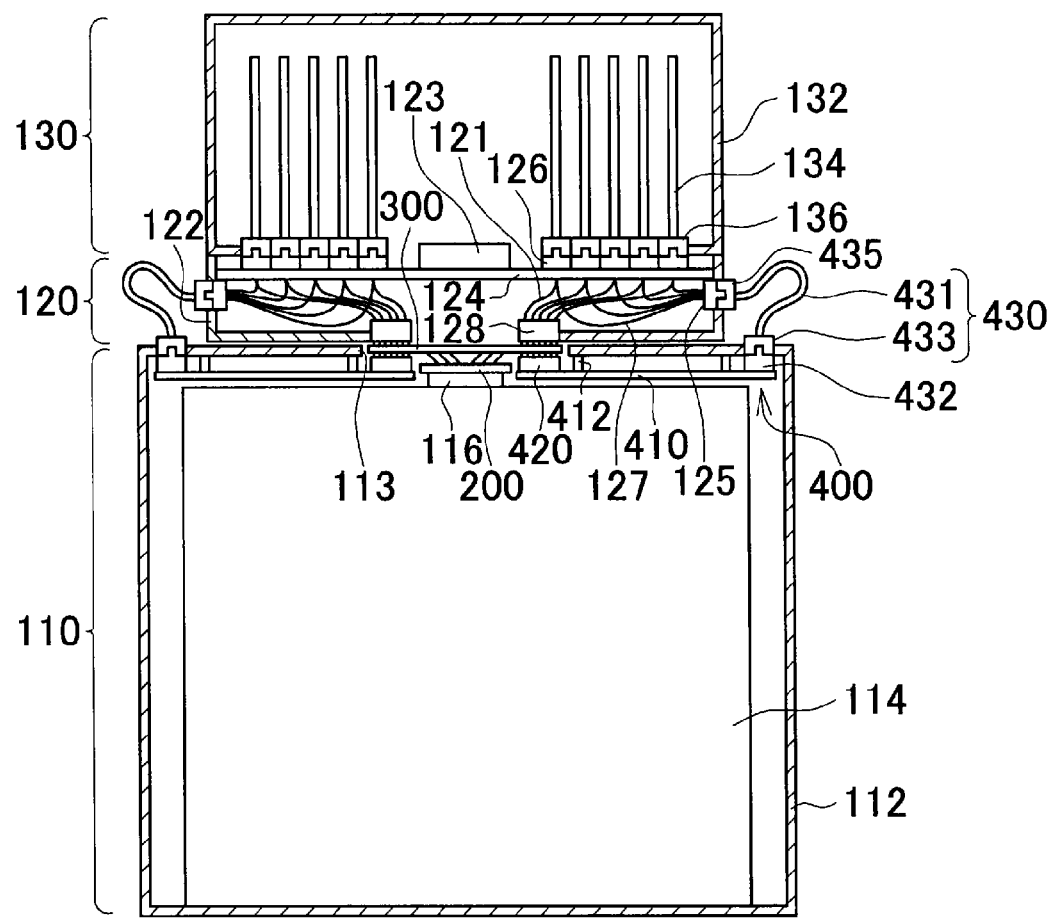
FIG. 5 schematically shows the entire structure of the test apparatus 100 according to an embodiment.

FIG. 5 shows a cross sectional view of the constituting elements of the test apparatus 100 in their assembled state. As shown in this drawing, the device under test 200 is held on the chuck 116 of the prober 110. The probe card 300 is mounted immediately above the chuck 116, with its probe pins 320 abutting against the device under test 200 from above.

Here, the upper end of each of the spring pins 421 of the pin module 420 abuts against a pad 340 on the lower surface of the probe card 300. The upper surface of the probe card 300 has substantially the same height as the upper surface of the prober 110.

The performance board 120 and the test head main body 130, coupled to each other, are mounted above the probe card 300. Here, the spring pins 129 of the pin module 128 abut against the pads 330 of the probe card 300.

Moreover, an end of the connectorized cable 430 is coupled to the cable connector 432 of the prober 110. The other end of the connectorized cable 430 is coupled to the cable connector 125 of the performance board 120.

FIG. 6 schematically shows a signal transfer path 400 formed in the test apparatus 100 in the above-described state. In the drawing, the device under test 200 and the probe pins 320 are brought into contact with each other to form electrical connection therebetween (arrow P in the drawing). As a result, a connection terminal of the device under test 200 is connected to any of the pads 330 and the pads 340 of the probe card 300.

Each of the pads 330 provided on the upper surface of the probe card 300 is connected to the performance board 120 via a spring pin 129 of a pin module 128 (arrow A). In the performance board 120, a pin module 128 is connected to any of the card connectors 126 via a connection cable 121, thereby creating a signal transfer path from the device under test 200 to any of the pin electronics cards 134.

The pads 340 provided on the lower surface of the probe card 300 are connected to the pin modules 420 (arrow B), and further to the cable connector 432 via the wiring (not shown in the drawing) on the connection substrate 410. The cable connector 432 is connected to the cable connector 125 on the performance board 120 via the connectorized cable 430 (arrows C and D). The cable connector 125 is connected to any of the card connectors 126 via the connection cable 127. According to the above arrangement, another signal transfer path from the device under test 200 to any of the pin electronics cards 134 is created.

With respect to the surface structure of the probe card 300, the probe card 300 has pads 330 and 340 in the same number respectively on the front side and the rear side thereof. Accordingly, the number of signal transfer paths created between the device under test 200 and the test head main body 130 can be doubled compared to the number of signal transfer paths created for a probe card 300 having pads 330 only on one side thereof facing the performance board 120.

In the present embodiment, a signal transfer path is formed via the internal space of the prober 110. Alternatively, a signal transfer path can be formed by taking out a cable from the lower surface of the probe card 300 either directly or via a connector. In that case, the number of signal transfer paths can be increased without changing the structure of the existing prober 110, if a notch is created on the substrate 310 of the probe card 300 to take out a cable.

In this way, a signal transfer path can include a test head connector electrically connected to a test head, a prober connector electrically connected to a prober connecting section, and a cable for electrically connecting the test head connector to the prober connector. According to this arrangement, the number of signal transfer paths between a device under test and a test head can be increased using comparatively inexpensive elements.

Note that a signal transfer path formed by the multicore cable 431 from the pad 340 via the internal space of the prober 110 has a longer length than a signal transfer path formed form the pad 330 via the spring pin 129. It is therefore preferable to allocate high frequency signals to a signal transfer path via the pads 330, because it is shorter.

The test head can communicate a low frequency signal with a device under test on a path via the transfer paths, and communicate a high frequency signal with a device under test on a path via the test head pins. By doing so, the transfer quality of a multitude of signals can be highly maintained since high frequency signals can be transferred via the test head pins, which is a shorter path.

Figure 7:
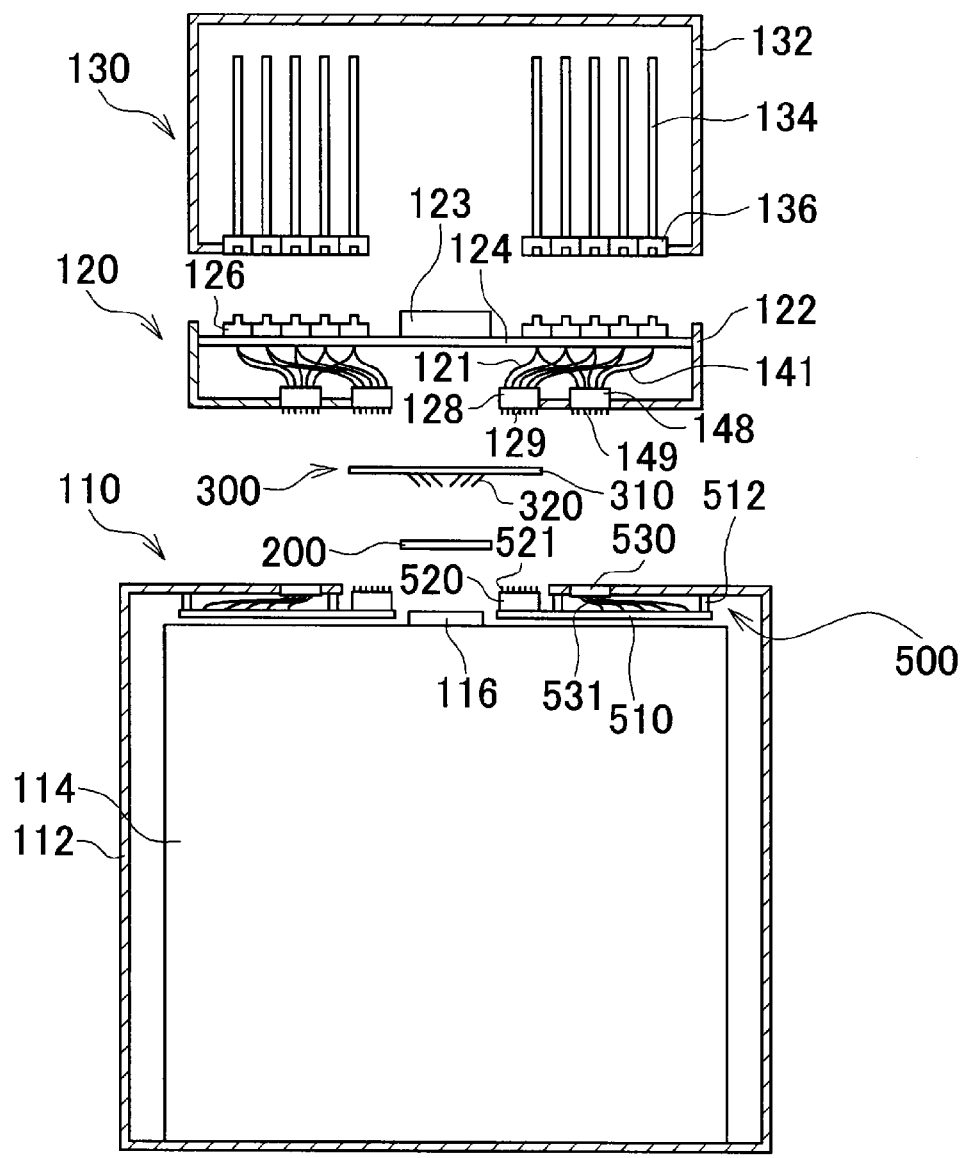
FIG. 7 is a view showing each constituting element of a test apparatus 101 separately from each other.

FIG. 7 is a view showing each constituting element of a test apparatus 101 according to the other embodiment, separately from each other. Note that the constituting elements in this test apparatus 101 that are the same as those in the test apparatus 100 are assigned the same reference numerals, to avoid redundant explanation in the following.

As shown in this drawing, in the test apparatus 101, the probe card 300 and the test head main body 130 have the same structure as their counterparts in the test apparatus 100 shown in FIG. 1. Moreover, the prober 110 has almost the same structure as that of its counterpart in the test apparatus 100, except for the structure of the signal transfer path 500.

Specifically, in the test apparatus 100, the signal transfer path 500 is formed to include a connection substrate 510 suspending from the inner upper surface 111 of the case 112 via a spacer 512. Pin modules 520 are mounted to one end of the connection substrate 510.

Pad modules 530 are mounted to the upper surface 111 of the case 112 of the prober 110, above the connection substrate 510. The pin modules 520 and the pad modules 530 are electrically connected to each other via wiring (not shown in the drawing) on the connection substrate 510 and via a connection cable 531. Each of the pin modules 520 includes a plurality of spring pins 521.

Also in the test apparatus 101, the performance board 120 further includes pin modules 148 that are to be positioned outside the probe card 300, in addition to the pin modules 128 to abut against the upper surface of the probe card 300. Each of the pin modules 148 also includes a plurality of spring pins 149 just as each of the pin modules 128. In addition, each of the pin modules 148 is connected to any of the card connectors 126 via a connection cable 141.

In the above-explained structure, it is preferable that the upper surface of the probe card 300 have the same height as the upper surface of the prober 110, when the probe card 300 is mounted to the prober 110. By doing so, both of the pin modules 128 and 148 can have favorable connection.

Figure 8:
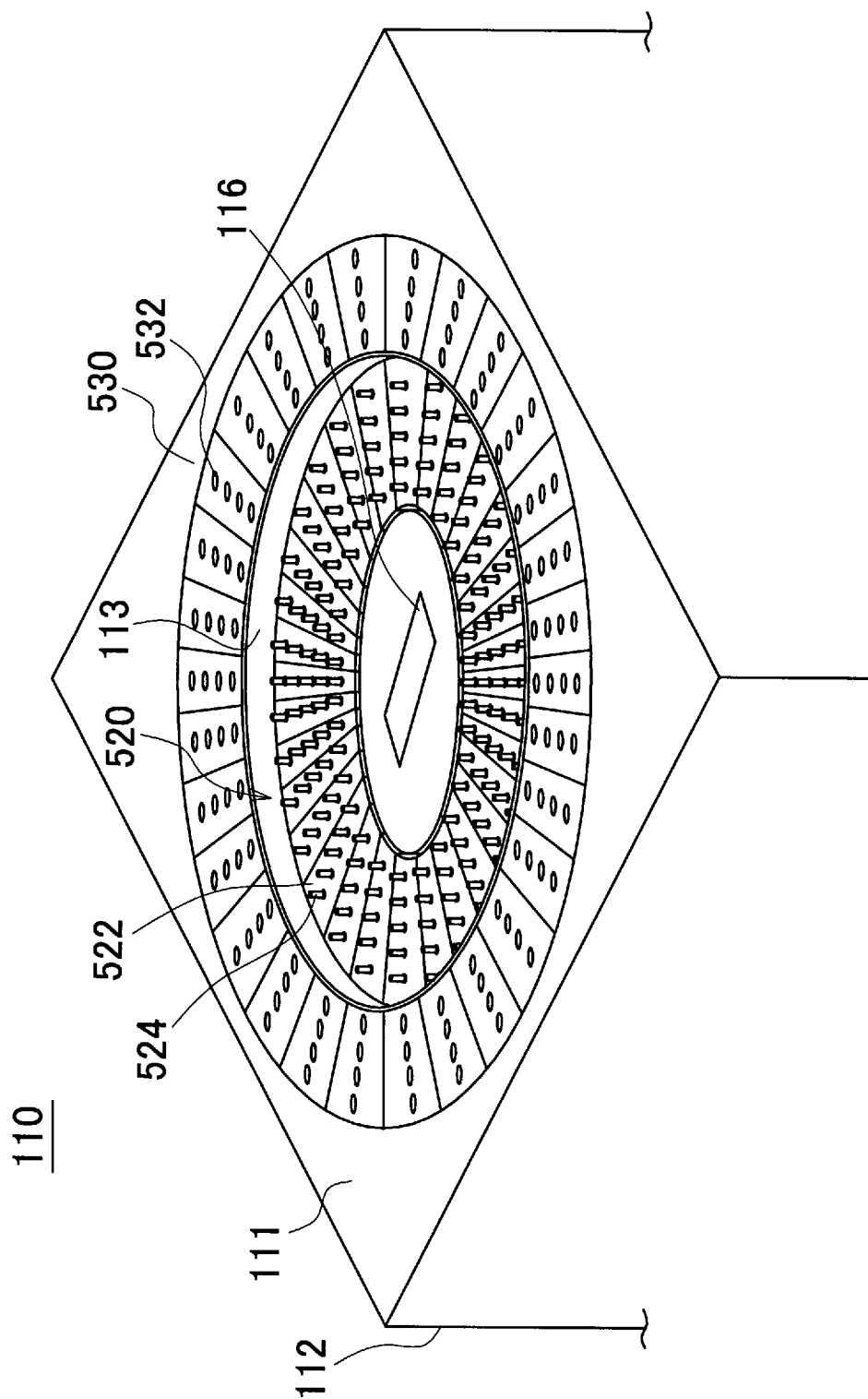
FIG. 8 shows the placement of each element on an upper surface 111 of a prober 110.

FIG. 8 shows a layout on the upper surface 111 of the prober 110 in the test apparatus 101. As shown in this drawing, inside the opening 113, a chuck 116 and pin modules 520 in annular formation to surround the chuck 116 are provided. This placement is the same as the placement in the test apparatus 100. Here, a difference from the test apparatus 100 is that pad modules 530 are provided in annular formation to surround the opening 113, on the upper surface 111 of the prober 110. Each of the pad modules 530 includes a plurality of pads 532.

In this way, the pads 532 are provided outside the opening 113, so that the spring pins 149 of the performance board 120, which are to abut against the pad 532, are provided outside the area facing or corresponding to the probe card 300. This layout is made possible by taking advantage of an empty space of the test apparatus 100, which prevents the test apparatus 101 to be larger in size.

Figure 9:
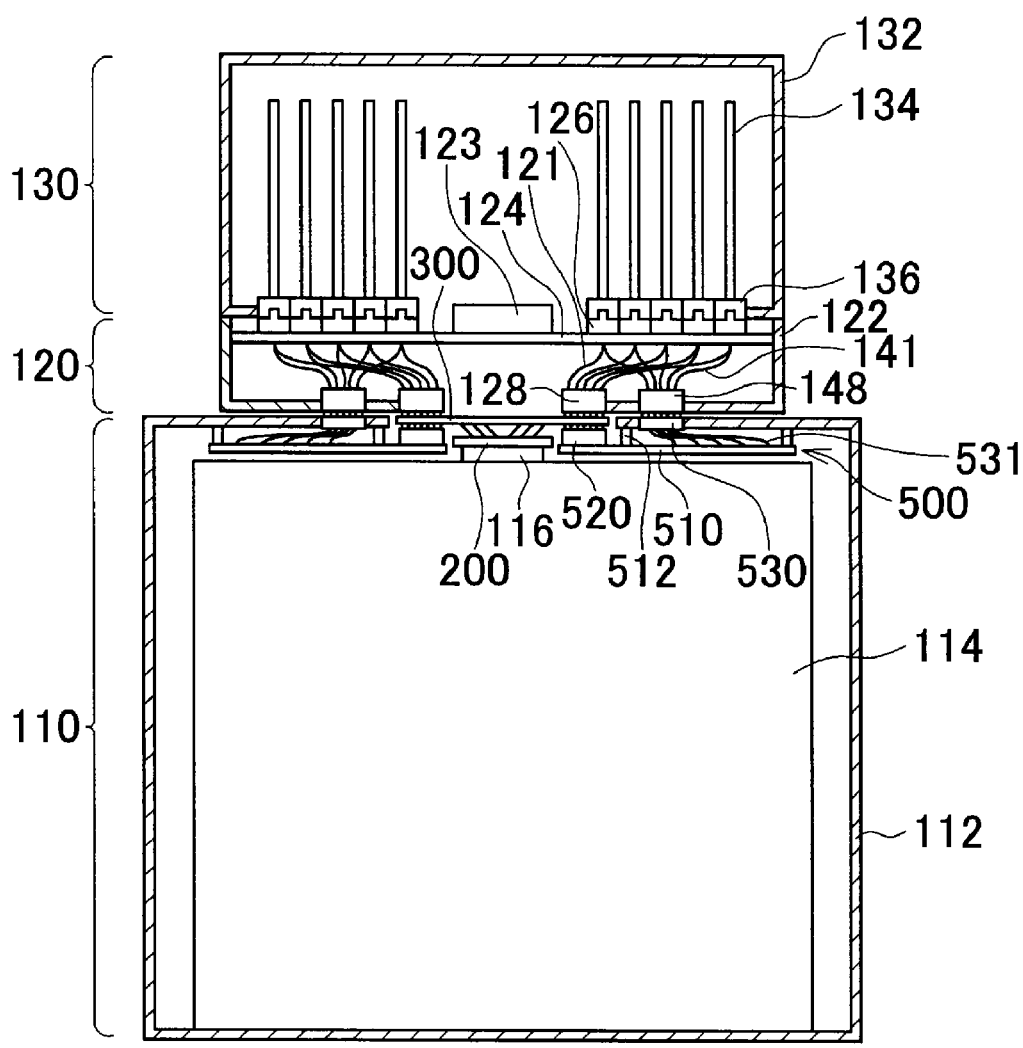
FIG. 9 is a schematic cross sectional view of the entire structure of the test apparatus 101 according to the other embodiment.

FIG. 9 is a cross sectional view of the test apparatus 101 in assembled state. As shown in this drawing, the upper end of each of the spring pins 521 abuts against the lower surface of the probe card 300. Accordingly, the pads 340 and the spring pins 521 are electrically connected to each other.

As regards the performance board 120, the spring pins 129 of the pin modules 128 abut against the pads 330 on the upper surface of the probe card 300, and the spring pins 149 of the pin modules 148 abut against the pads 532 of the pad modules 530, to enable electrical connection therebetween.

Figure 10:
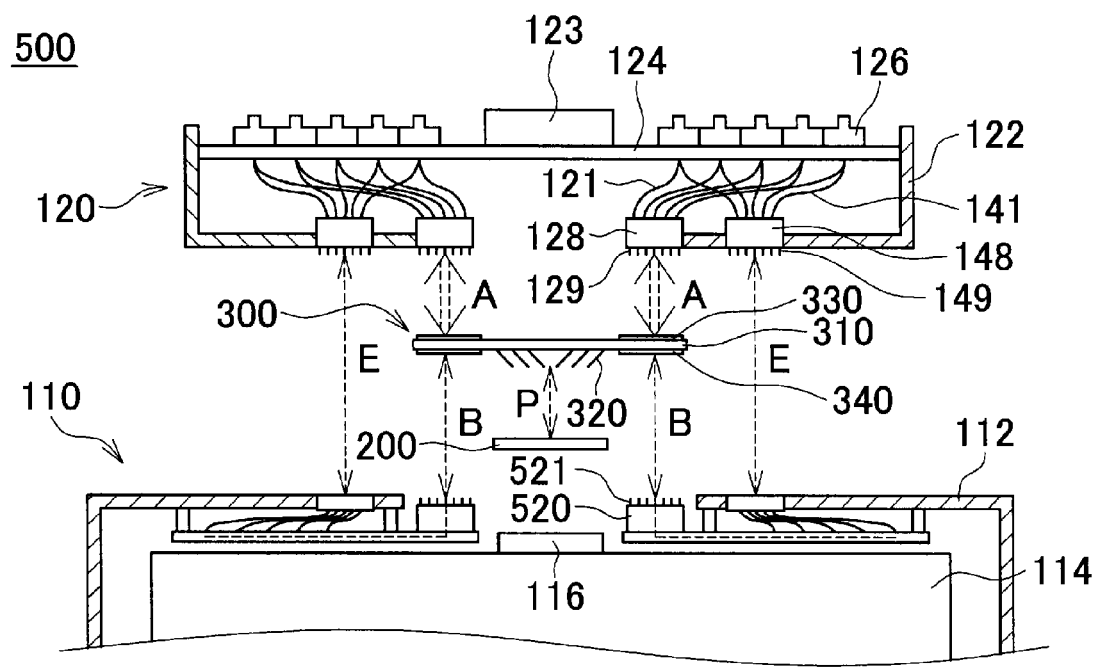
FIG. 10 schematically shows the structure of a signal transfer path 500 formed in the test apparatus 101.

FIG. 10 schematically shows the structure of a signal transfer path 500 formed in the test apparatus 101 assembled in the above manner. In the drawing, the device under test 200 and the probe card 300 are electrically connected to each other via the probe pins 320, as shown in the arrow P in the drawing. As a result, a connection terminal of the device under test 200 is connected to any of the pads 330 and the pads 340 of the probe card 300.

Each of the pads 330 provided on the upper surface of the probe card 300 is connected to the performance board 120 via a spring pin 129 of a pin module 128 (arrow A). In the performance board 120, a pin module 128 is connected to any of the card connectors 126 via a connection cable 121, thereby creating a signal transfer path from the device under test 200 to any of the pin electronics cards 134.

The pads 340 provided on the lower surface of the probe card 300 are connected to the pad modules 530 via the pin modules 520, the wiring (not shown in the drawing) on the connection substrate 510, and the connection cable 531 (arrow B). The pad modules 530 are connected to the pin modules 148 (arrow E). According to the above arrangement, another signal transfer path from the device under test 200 to any of the pin electronics cards 134 is created.

In this way, a signal transfer path can have a plurality of transfer path pins provided on an area of a surface of the test head facing the prober, the area not corresponding to (or not facing) where the probe card is placed. The signal transfer path can also have transfer path pads provided on an area of a surface of the prober facing the test head, the area also not corresponding to (or not facing) where the probe card is placed, where the transfer path pads are electrically connected to the transfer path pins as well as electrically connected to the prober connection section. Accordingly, the number of signal transfer paths can be increased beyond the limitation of the package density of the transfer path pins. Moreover, the test apparatus in the present case can be operated as in the same manner as a general test apparatus having pads solely on a surface of the probe card facing the test head.

Figure 11:
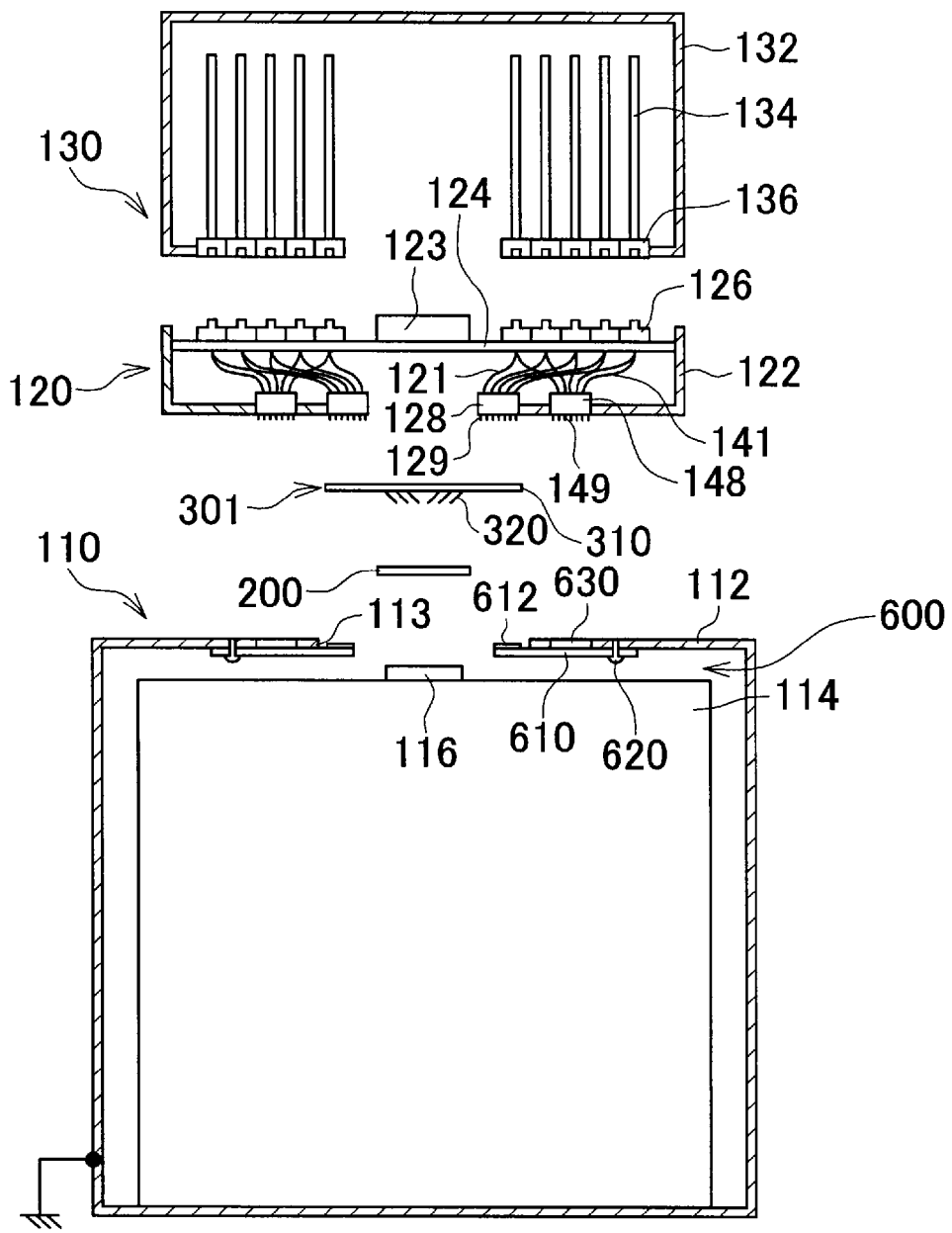
FIG. 11 is a view showing each constituting element of a test apparatus 102 separately from each other.

FIG. 11 is a view showing each constituting element of a test apparatus 102 according to still another embedment, separately from each other. As shown in this drawing, the test head including the test head main body 130 and the performance board 120 of the test apparatus 102 has the same structure as the test head in the test apparatus 101.

However, the signal transfer path 600 formed in the prober 110 has a different structure. Also, as detailed later, the structure of the probe card 301 of the test apparatus 102 is different, and how it is mounted to the prober 110 is also different from the other embodiments.

In the test apparatus 102, the signal transfer path 600 is formed to include a connection substrate 610 mounted to the inner upper surface of the case 112 of the prober 110 using a screw 620. Seen from the test head side, one end of the connection substrate 610 protrudes towards the center of the opening 113 provided on the upper surface 111 of the case 112. Moreover, the pad modules 630 are provided above the connection substrate 610, to be exposed on the surface of the upper surface 111. The connection substrate 610 having this configuration is in contact with the case 112, and so can save space within the prober 110.

Figure 12:
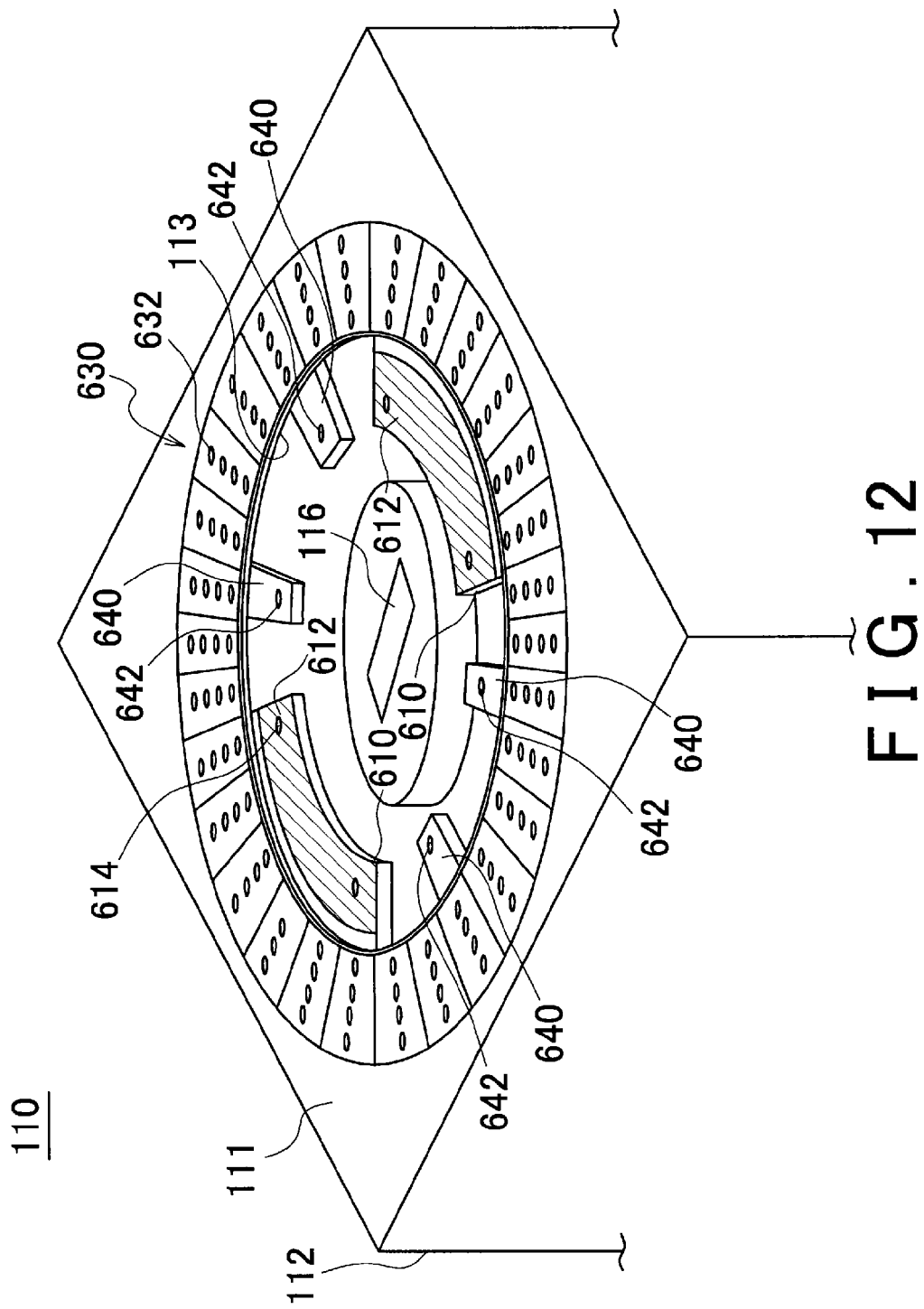
FIG. 12 shows the placement of each element on an upper surface 111 of a prober 110.

FIG. 12 shows the placement of each element on an upper surface 111 of a prober 110. As shown in this drawing, on the upper surface of the prober 110, a ground pad 612 formed on the end of a connection substrate 610 protrudes towards the center of the opening 113. The pad modules 630 of the connection substrate 610 are placed to be exposed in annular shape to surround the opening 113. Each pad module 630 includes a plurality of pads 632.

In the prober 110, mounts 640 are also provided to protrude towards the center of the opening 113 in plan view. A threaded hole 642 is provided through each of the mounts 640. Note that the distance between the upper surfaces of the ground pads 612 of the connection substrate 610 and the mounts 640 and the upper surface 111 of the case 112 is equal to the thickness of the probe card 301.

Figure 13:
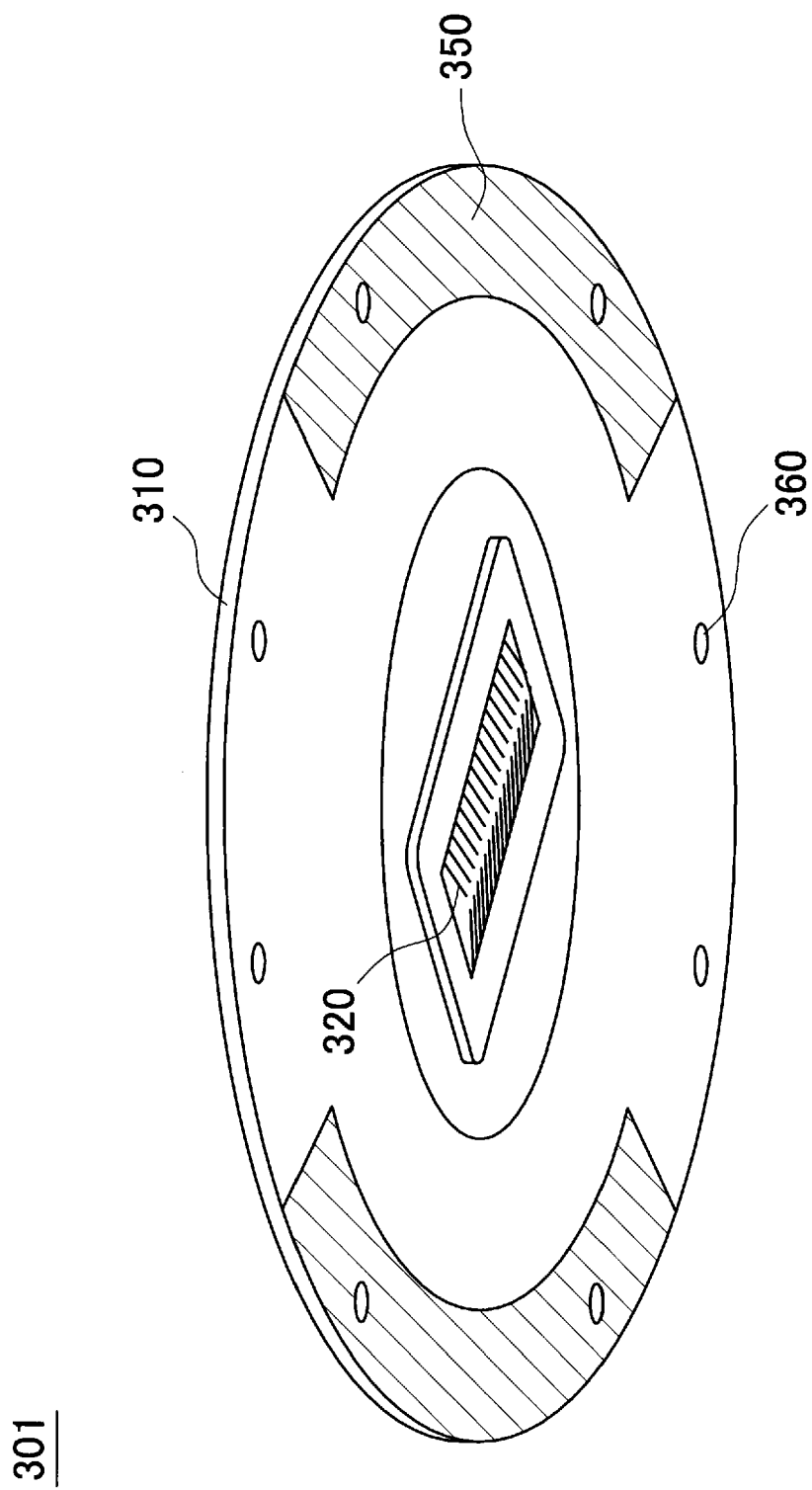
FIG. 13 is a view of a probe card 301 of the test apparatus 102, seen from the prober 110.

FIG. 13 is a view of the probe card 301 in the test apparatus 102, seen from the prober 110 (i.e. looked up at from below). Note that the structure of the upper surface of this probe card 301 looking down from the test head (i.e. looked down from above) is equal to the structure of the probe card 300.

As shown in this drawing, probe pins 320 are provided in the center of the lower surface of the probe card 301. In addition, a pair of wide ground pads 350 are formed in arc shapes, at respective portions of the periphery of the lower surface of the probe card 301. These ground pads 350 are connected to probe pins 320 that are connected to the ground terminal of the device under test 200.

In addition, a plurality of thread holes 360 are formed in constant spacing therebetween along the periphery of the probe card 301. The probe card 301 can be fixed to the prober using screws provided through these thread holes 360, as detailed later.

Figure 14:
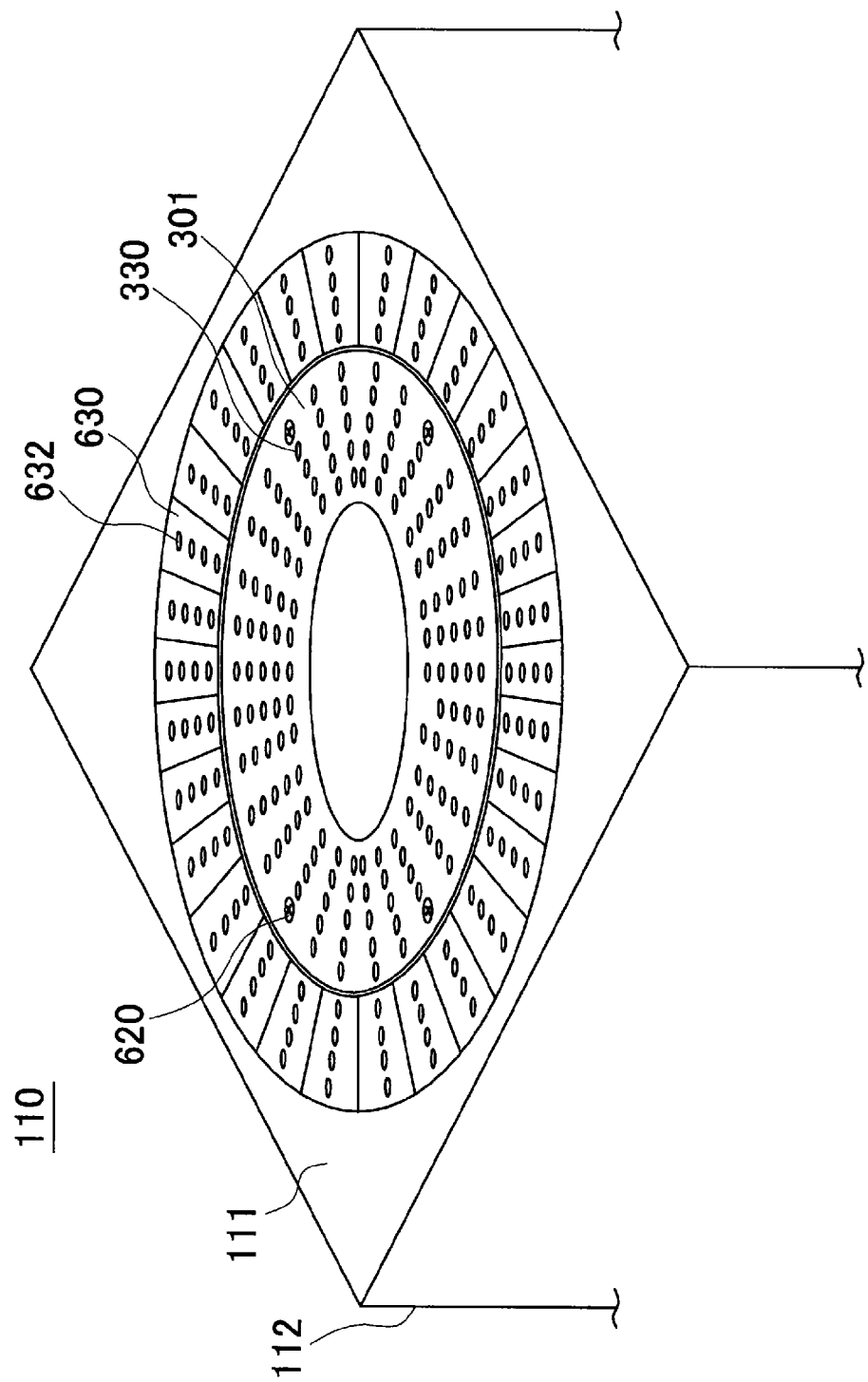
FIG. 14 is a view of a probe card 300 mounted to the prober 110.

FIG. 14 is a view of the probe card 301 mounted to the prober 110. As shown in this drawing, the probe card 301 substantially seals the opening 113. The probe card 301 is provided with the thread holes 360, to be firmly fixed using the screws 620 in threaded attachment with the thread holes 614 of the mounts 640 and the connection substrate 610. This arrangement prevents shifting in position of the probe card 301.

Consequently, the height of the upper surface of the probe card 301 is the same as the height of the upper surface of the prober 110, to form a flat surface as a whole. Accordingly, on the upper surface of the prober 110 to which the probe card 301 is mounted, the pads 330 of the probe card 301 is aligned with the pads 632 of the pad modules 630. As a result, the spring pins 129 and 149 of the pin modules 128 and 148 of the performance board 120 are in favorable electrical connection with respect to each of the pads 330 and 632.

Figure 15:
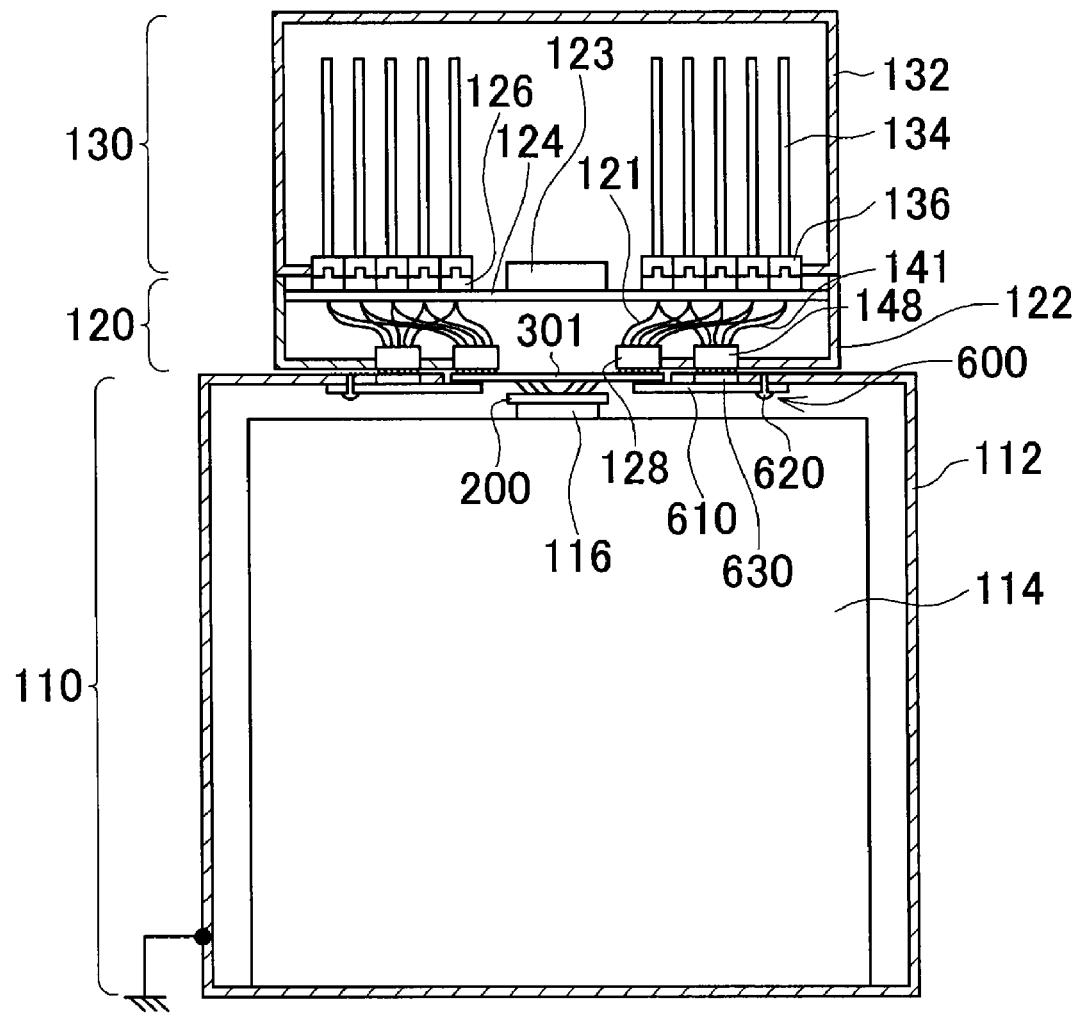
FIG. 15 is a schematic cross sectional view of the entire structure of the test apparatus 102 according to still another embodiment.

FIG. 15 is a schematic cross sectional view of the structure of the test apparatus 102 in assembled state. As shown in this drawing, the ground pad 612 of the connection substrate 610 and the ground pad 350 of the probe card 301 are abutted against each other to form electric connection therebetween. In addition, the pin modules 148 of the performance board 120 abut against the pad modules 630, thereby forming a signal transfer path 600 from the ground pad 612 of the connection substrate 610 to the pin electronics cards 134.

Figure 16:
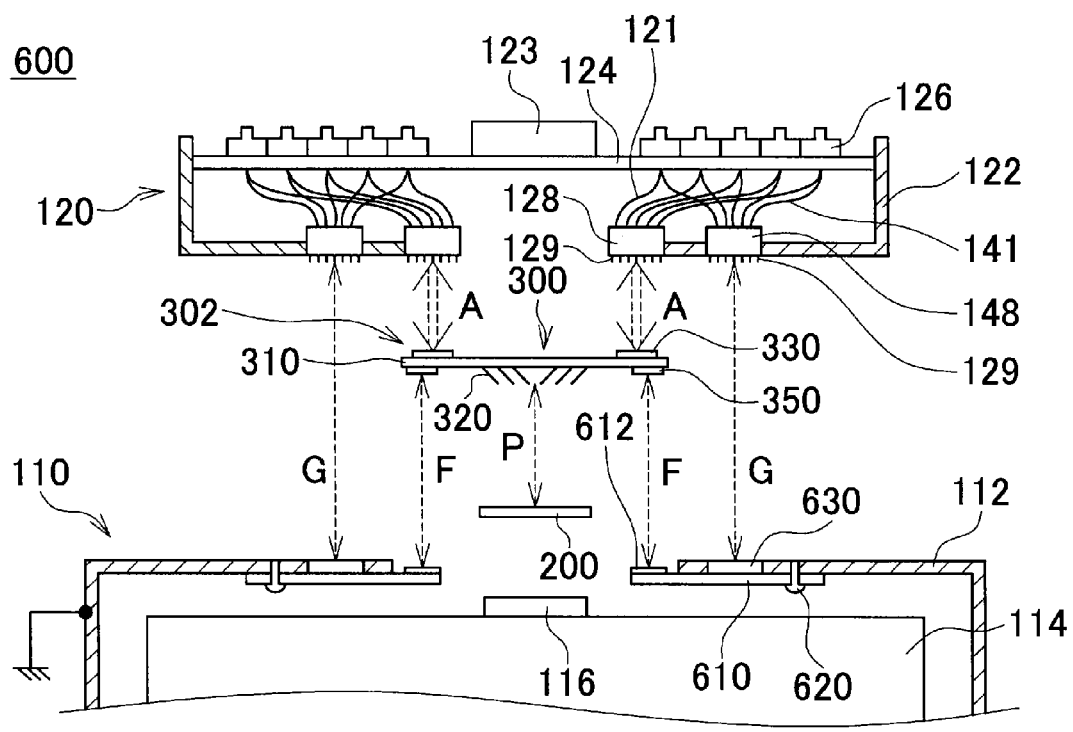
FIG. 16 schematically shows the structure of a signal transfer path 600 formed in the test apparatus 102.

FIG. 16 schematically shows the structure of a signal transfer path 600 formed in the test apparatus 102. In the drawing, the device under test 200 and the probe card 301 are electrically connected to each other via the probe pins 320, as shown in the arrow P in the drawing. As a result, a connection terminal of the device under test 200 is connected to any of the ground pads 350 and the pads 330 of the probe card 301.

Each of the pads 330 provided on the upper surface of the probe card 300 is connected to the performance board 120 via a spring pin 129 of a pin module 128 (arrow A). In the performance board 120, a pin module 128 is connected to any of the card connectors 126 via a connection cable 121, thereby creating a signal transfer path from the device under test 200 to any of the pin electronics cards 134.

On the other hand, a ground pad 350 on the lower surface of the probe card 300 is connected to a pad module 630 via wiring (not shown in the drawing) on the connection substrate 610 (arrow F). A pad module 530 is connected to a pin module 148 (arrow G). According to the above arrangement, another signal transfer path from the device under test 200 to any of the pin electronics cards 134 is created.

In this way, the test head may be electrically connected to a ground terminal of a device under test on a path via the transfer path, and be electrically connected to a signal terminal of the device under test on a path via the test head pins. This helps reduce the number of constituting elements of the transfer circuit.

Moreover, there may be also provided a fixing section for fixing the probe card to the prober so that the height of the surface of the probe card facing the test head is substantially equal to the height of the surface of the prober facing the test head. This arrangement can ensure that the transfer path formed in the area outside the probe card exhibits high quality electric connection, which is equal to the connection between the test head and the probe card.

As detailed above, the test apparatuses 100, 101, and 102 are able to increase the number of signal transfer paths from a device under test to a test head, without changing the size of the probe card. Accordingly, the test apparatuses 100, 101, and 102 can be used as a general test apparatus, as well as testing, using a multitude of signal transfer paths, any device under test having a great number of terminal pads such as a liquid crystal display device driving apparatus.

Although some aspects of the present invention have been described by way of exemplary embodiments, it should be understood that those skilled in the art might make many changes and substitutions without departing from the spirit and the scope of the present invention which is defined only by the appended claims.

What is claimed is:

1. A test apparatus for testing a device under test, comprising:
    a test head that communicates a signal with the device under test and tests the device under test;
    a prober on which the device under test is mounted; and
    a probe card that is positioned between the test head and the prober and that transfers a signal between the test head and the device under test, the probe card having a front side facing the test head and a rear side facing the prober, wherein
    the test head includes a plurality of test head pins on a surface of the test head facing the front side of the probe card, the plurality of test head pins being electrically connected to the probe card,
    the probe card includes: a plurality of probe pins that are provided on a surface of the rear side of the probe card and that are electrically connected to a terminal of the device under test; a plurality of test head pads that are provided on a surface of the front side of the probe card and that are electrically connected to the test head pins and to the probe pins; and prober pads that are provided on a surface of the rear side of the probe card and that are electrically connected to the probe pins, and
    the prober includes: a prober connection section that is provided on a surface of the prober facing the rear side of the probe card and that is electrically connected to the prober pads; and a transfer path that transfers a signal between the test head and the prober connection section.

2. The test apparatus according to claim 1, wherein the test head communicates, on a path via the transfer path, a low frequency signal with the device under test, and communicates a signal of a frequency higher than the low frequency signal on a path via the test head pins.

3. The test apparatus according to claim 2, wherein the test head is electrically connected to a ground terminal of the device under test on the path via the transfer path, and is electrically connected to a signal terminal of the device under test on the path via the test head pins.

4. The test apparatus according to claim 1, wherein the transfer path includes:
    a test head connector electrically connected to the test head;
    a prober connector electrically connected to the prober connection section; and a cable electrically connecting the test head connector to the prober connector.

5. A test apparatus for testing a device under test, comprising:
a test head that communicates a signal with the device under test and tests the device under test;
a prober on which the device under test is mounted; and
a probe card that is positioned between the test head and the prober and that transfers a signal between the test head and the device under test, wherein
the test head includes a plurality of test head pins on a surface of the test head facing the probe card, the plurality of test head pins being electrically connected to the probe card,
the probe card includes: a plurality of probe pins that are provided on a surface of the probe card facing the prober and that are electrically connected to a terminal of the device under test; a plurality of test head pads that are provided on a surface of the probe card facing the test head and that are electrically connected to the test head pins and to the probe pins; and prober pads that are provided on a surface of the probe card facing the prober and that are electrically connected to the probe pins, and
the prober includes: a prober connection section that is provided on a surface of the prober facing the probe card and that is electrically connected to the prober pads; and a transfer path that transfers a signal between the test head and the prober connection section, wherein
the transfer path includes:
a plurality of transfer path pins provided on a surface of the test head facing the prober, so as not to face the probe card; and
a plurality of transfer path pads provided on a surface of the prober facing the test head, so as not to face the probe card, the plurality of transfer path pads being electrically connected to the transfer path pins and to the prober connection section.

6. The test apparatus according to claim 5, further comprising:
a fixing section that fixes the probe card to the prober so that a height of a surface of the probe card facing the test head is substantially equal to a height of the surface of the prober facing the test head.

7. The test apparatus according to claim 5, wherein
the transfer path pins are provided to surround the probe card.

8. A probe card provided between a test head and a prober within a test apparatus that tests a device under test, the test head communicating a signal with the device under test and testing the device under test, and the prober having the device under test mounted thereon,
the probe card transferring a signal between the test head and the device under test and having a front side facing the test head and a rear side facing the prober, the probe card comprising:
a plurality of probe pins that are provided on a surface of the rear side of the probe card and that are electrically connected to a terminal of the device under test;
a plurality of test head pads that are provided on a surface of the front side of the probe card and that are electrically connected to test head pins on the test head and to the probe pins; and
prober pads provided on a surface of the rear side of the probe card, electrically connected to a prober connection section on the prober, electrically connected to the test head via a transfer path, and electrically connected to the probe pins, where the transfer path connects the prober connection section to the test head.

\* \* \* \* \*